US005517143A

United States Patent [19]

Gross

[11] Patent Number: 5,517,143

[45] Date of Patent: May 14, 1996

[54] CURRENT MIRROR CIRCUITS AND METHODS WITH GUARANTEED OFF STATE AND AMPLIFIER CIRCUITS USING SAME

[75] Inventor: William H. Gross, Sunnyvale, Calif.

[73] Assignee: Linear Technology Corporation, Milpitas, Calif.

[21] Appl. No.: 346,395

[22] Filed: Nov. 29, 1994

[51] Int. Cl.$^6$ .......... H03K 3/00

[52] U.S. Cl. .......... 327/108; 327/307; 330/288

[58] Field of Search .......... 327/108, 535, 327/530; 323/315, 316, 307; 330/288, 291

[56] References Cited

U.S. PATENT DOCUMENTS

| | | | |
|---|---|---|---|
| 4,879,524 | 11/1989 | Bell | 330/288 |
| 4,977,336 | 12/1990 | Martiny | 323/316 |
| 5,057,792 | 10/1991 | Gay | 323/315 |
| 5,073,759 | 12/1991 | Mead et al. | 330/288 |

OTHER PUBLICATIONS

"Elantec EL4095C Video Gain Control/Fader/Multiplexer," Elantec, Inc. Data Sheet Rev. A, Milpitas, California, pp. 1–24, published Aug. 1993.

"Gennum GT4123, GT4123A Two Channel Video Multipliers," Gennum Corporation Preliminary Data Sheet, Canada, pp. 1–5, published Jun. 1992.

"Linear Technology LT1251/LT1256 40 MHz Video Fader and DC Gain Controlled Amplifier," Linear Technology Corporation Data Sheet, Milpitas, California, pp. 1–24, published May 1994.

*Primary Examiner*—John S. Heyman
*Assistant Examiner*—Kenneth B. Wells
*Attorney, Agent, or Firm*—Fish & Neave; Mark D. Rowland; Robert W. Morris

[57] ABSTRACT

Current mirror circuits and methods, and an amplifier using same, are provided in which the output of the current mirror is reduced to zero when the input current falls below a predetermined threshold. An offset current is subtracted from the input (or reference) current at input currents below the threshold. Otherwise, the offset current source is turned off. Thus, the output current can be reduced to zero, even if there is a small input current, without distorting the input-output relationship over the majority of the range of operation of the current mirror. An amplifier with two current-feedback complementary input stages (or fader circuit) is also provided which includes a gain control circuit that uses the current mirror circuits of the present invention to ensure that each input can be fully attenuated. The gain control circuit causes one of the two inputs to be fully attenuated when a control voltage passes one of two thresholds that are offset by predetermined amounts from the corresponding endpoints of the control voltage range. The amplifier thus provides an accurate, undistorted gain value for a given control voltage over the majority of its range of operation.

22 Claims, 7 Drawing Sheets

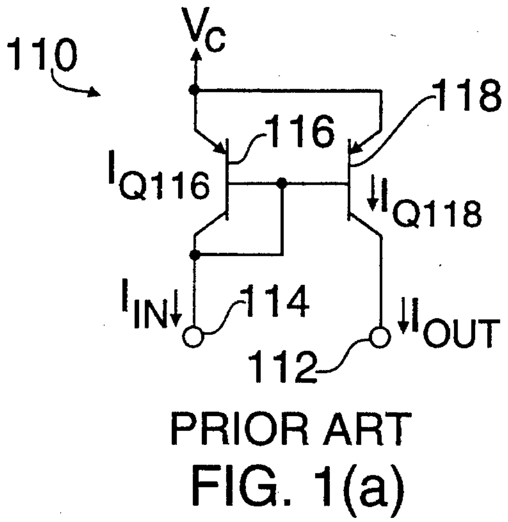
PRIOR ART
FIG. 1(a)
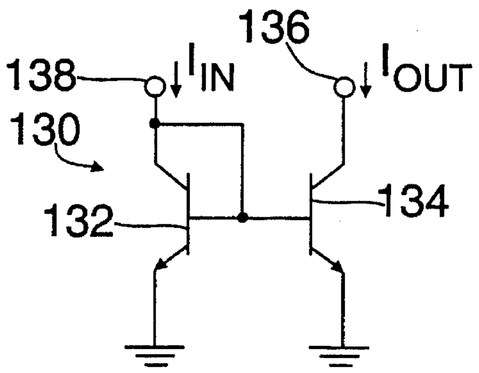
PRIOR ART
FIG. 1(b)
PRIOR ART
FIG. 1(c)
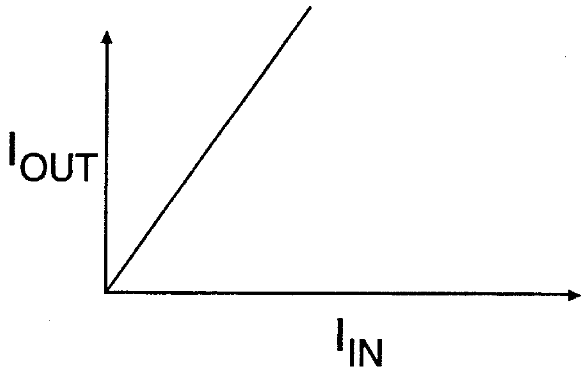
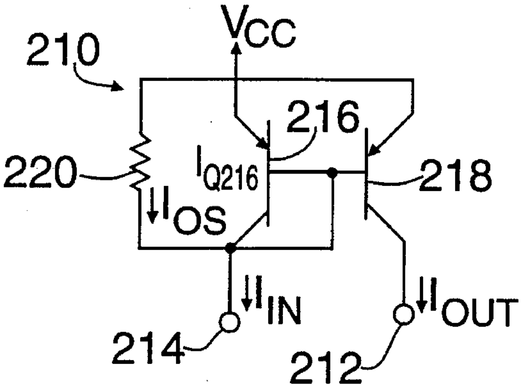
PRIOR ART
FIG. 2(a)
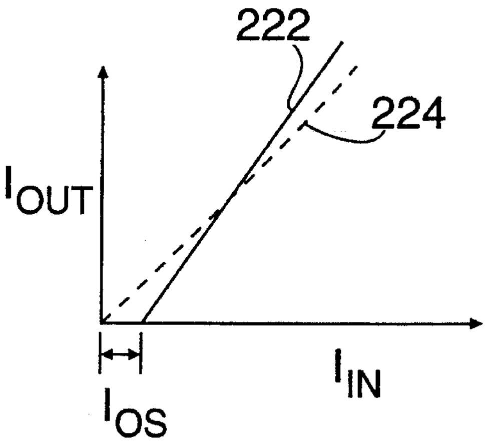
PRIOR ART
FIG. 2(b)

CURRENT MIRROR CIRCUITS AND METHODS WITH GUARANTEED OFF STATE AND AMPLIFIER CIRCUITS USING SAME

BACKGROUND OF THE INVENTION

This invention relates to current mirror circuits and amplifiers and other circuits incorporating current mirror circuits. More particularly, the present invention relates to circuits and methods for ensuring that the output current of a current mirror can be reduced to zero and to a variable-gain amplifier employing the current mirror circuits and methods to ensure that an input signal can be fully attenuated.

The operation of current mirror circuits, formed from two or more bipolar junction transistor devices coupled such that the base-emitter voltages of the two devices are equal, is well known. A desirable feature of such circuits is that an input current passing through one branch of the circuit is accurately reflected in an output current passing through a second branch. The accuracy of the circuit is typically facilitated by fabricating the two transistor devices on the same chip, where the intrinsic parameters of the two devices are nearly equal, such that the currents through the two devices have a substantially linear relationship, whereby each current is substantially proportional to the emitter area of the corresponding transistor.

Current mirrors are useful in a variety of circuits, including electronically controlled amplifiers and video faders. For example, such amplifiers and faders may operate by converting a control voltage to a control current. The control current is then reflected in a current mirror which acts as a current source to provide gain control. These amplifiers and faders provide accurate gain control because the reflected current follows the control voltage with accuracy.

In many applications, the control voltage is produced by an inexpensive operational amplifier which often has a small offset error. When the control voltage is at its minimum, the offset error may prevent the control current generated by the current mirror from being reduced to zero, resulting in inadequate attenuation of the signal passing through the amplifier. Thus, a serious side effect of accurate gain control in such an amplifier is that it can prevent the amplifier from providing the attenuation required to make a signal indiscernible.

Amplifier circuit designs using current mirrors are frequently based on variable-transconductance multiplier circuits which use cross-coupled differential stages. These multiplier circuits typically have two differential pairs of input transistors connected in parallel to input terminals where a first differential input voltage is applied. The outputs of the differential transistor pairs are cross-coupled. Each differential pair is coupled in series with one of a second pair of transistors which are coupled to receive a second differential input voltage. The magnitudes of the currents through the cross-coupled outputs differ as a function of the product of the first and second differential input voltages. The differential output current is used to produce an output voltage which is also a function of the product of the differential input voltages. When used as an amplifier, a variable-transconductance multiplier circuit usually has the first differential input voltage coupled to the gain control signal and the second differential input voltage coupled to the signal being amplified. Current feedback circuitry can be used to couple the output voltage to the second differential input voltage to control the maximum gain, as is well known in the art.

One limitation of this amplifier design is that the two cross-coupled differential pairs can control the gain of only a single differential input (due to the fact that the second differential input is coupled to the signal being amplified). This prevents the precise gain control derived from the amplifier from being easily applied to multiple-input circuits, such as video faders.

Another disadvantage of this type of amplifier circuit is that they typically consist of a single type of transistor device (such as an NPN-BJT) and are not well balanced for accurately reproducing signals whose polarity may invert. For example, negative polarity output voltages can be produced only by subtracting from one of the output currents either an average current signal or the other output current.

Furthermore, the gain of the input signal can be minimized only if the differential gain control input is precisely zero, which results in the input signal being multiplied by zero. Any error in the gain control input results in either a noninverted or inverted output of undesirable magnitude. Thus, even if two such amplifiers were coupled to inversely-related control signals to construct a fader, small errors in the differential gain control could prevent the amplifier from providing the required attenuation.

Errors in the differential gain control voltage often derive from offset errors in operational amplifiers that supply the gain control voltage. The differential gain control voltage is usually obtained by driving control currents across diode junctions. As described above, control currents are typically obtained from current mirror circuits which are themselves controlled by a voltage control signal. Because the voltage control signal is usually produced from an inexpensive operational amplifier (including the small unavoidable offset error), the current mirrors may prevent the magnitude of the differential gain control voltage from reaching its minimum. This results in inadequate attenuation of the signal passing through one of the amplifiers.

For example, in a typical video fader employing two amplifier circuits, the gain of one input signal may need to be reduced by a factor of 1,000 (i.e., 60 dB) to prevent its image from being visible as the magnitude of a second input increases. If the linear control voltage operates in a full scale level of 0–2.5 V, the error must be less than 2.5 mV. This requirement is much better than inexpensive operational amplifiers can achieve without trimming.

Prior amplifiers often induce an offset error in the control circuitry to ensure that the control current can be reduced to zero at control voltage levels slightly greater than zero. This offset error can be produced in the current mirror which controls the amplifier gain in response to the control voltage. Gain errors are also often added to the current mirror circuit to adjust the realized control current function closer to the ideal function at higher current levels. A disadvantage of this approach is that the gain is distorted, such that the actual control current, and therefore amplifier gain, differ from their ideal levels at all but a single operating point.

In view of the foregoing, it would be desirable to provide a circuit and method for assuring that the output current of a current mirror can be reduced to zero when the input current falls below a predetermined error level.

It would also be desirable to provide a circuit and method for assuring that the output current of a current mirror accurately reproduces the ideal linear response over the majority of the range of operation.

It would be further desirable to provide an electronically controlled amplifier circuit having at least two input stages with current feedback, wherein the gain of each input is controlled by current steering.

It would be still further desirable to provide an electronically controlled amplifier with at least two current feedback input stages employing current steering, wherein complementary circuits are used to provide a more balanced response.

It would be even still further desirable to provide a circuit and method for controlling an accurate amplifier such that the gain is assured of being reduced to its minimum level when the control voltage falls below a threshold that is offset by a predetermined amount from its ideal minimum level.

Additionally, it would be desirable to provide a circuit and method for controlling an electronically controlled fader circuit, wherein the gain of each selected input is assured of being reduced to its ideal minimum level and the gain of the remaining inputs are assured of reaching the ideal maximum level when the control voltage reaches a corresponding extreme that is offset by a predetermined amount from the ideal extreme.

SUMMARY OF THE INVENTION

It is an object of the invention to provide a circuit and method for assuring that the output current of a current mirror can be reduced to zero when the input current falls below a predetermined error level.

It is another object of the invention to provide a circuit and method for assuring that the output current of a current mirror accurately reproduces the ideal linear response over the majority of the range of operation.

It is a further object of this invention to provide an electronically controlled amplifier circuit having at least two input stages with current feedback, wherein the gain of each input is controlled by current steering.

It is still a further object of this invention to provide an electronically controlled amplifier with at least two current feedback input stages employing current steering, wherein complementary circuits are used to provide a more balanced response.

It is yet a further object of this invention to provide a circuit and method for controlling an accurate amplifier such that the gain is assured of being reduced to its minimum level when the control voltage falls below a threshold that is offset by a predetermined amount from its ideal minimum level.

It is still yet a further object of this invention to provide a circuit and method for controlling an electronically controlled fader circuit, wherein the gain of each selected input is assured of being reduced to its ideal minimum level and the gain of the remaining inputs are assured of reaching the ideal maximum level when the control voltage reaches a corresponding extreme that is offset by a predetermined amount from the ideal extreme.

In accordance with these and other objects of the invention, there is provided a current mirror circuit and method in which the output of an offset current source is subtracted from the input current, and in which the offset current source is turned off when the input current exceeds a predetermined threshold. Providing an offset current source that can be turned off assures that the output current can be reduced to zero without distorting the input-output relationship over the majority of the range of operation.

There is also provided a highly accurate amplifier having two current-feedback complementary input stages. The amplifier includes a gain control circuit which uses the above-described current mirror to force the gain of each signal to its minimum level when the control voltage passes a threshold that is offset by a predetermined amount from the corresponding endpoint of its ideal linear range. The amplifier, which may be used to control a fader circuit, thus provides an accurate, undistorted gain value for a given control voltage over the majority of its range of operation.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which:

FIG. 1(*a*) is a schematic diagram of a conventional current mirror circuit employing PNP transistors;

FIG. 1(*b*) is a schematic diagram of a conventional current mirror circuit employing NPN transistors;

FIG. 1(*c*) is a general illustration of the relationship between input current and output current in the current mirror circuits of FIGS. 1(*a*) and 1(*b*);

FIG. 2(*a*) is a schematic diagram of a conventional current mirror circuit employing an induced offset error;

FIG. 2(*b*) is a general illustration of the relationship between input current and output current in the current mirror circuit of FIG. 2(*a*);

FIG. 3(*b*) is a general illustration of the relationship between input current and the output current in the current mirror circuit of FIG. 3(*a*);

FIG. 7(*b*) is a general illustration of the relationship between control voltage and control current for the gain control circuit FIG. 7(*a*);

FIG. 7(*c*) is a general illustration of the relationship between control voltage and the predistorted control voltages of the gain control circuit of FIGS. 7(*a*).

FIG. 7(*d*) is a general illustration of the relationship between control voltage and the gains of the two inputs of the gain control circuit of FIG. 7(*a*) when driving the amplifier circuit of FIG. 5.

DETAILED DESCRIPTION OF THE INVENTION

Figure 3A:
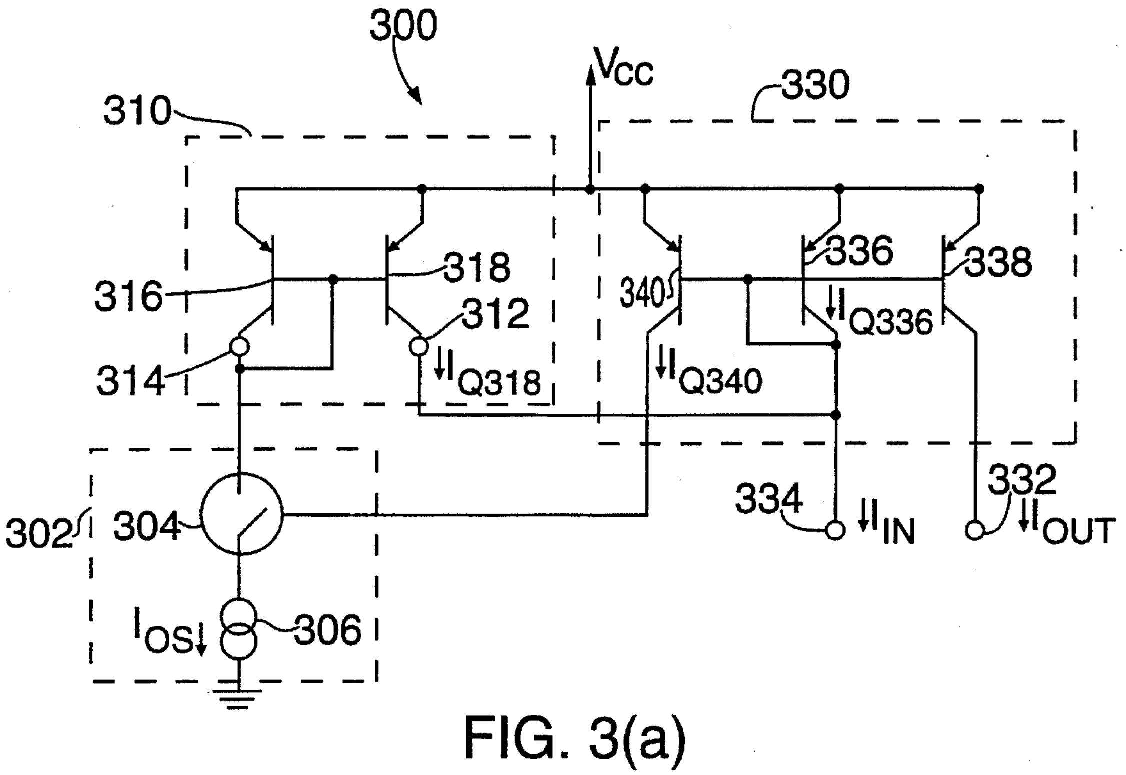
FIG. 3(*a*) is a schematic diagram of one embodiment of a current mirror circuit and method in accordance with the principles of the present invention.

Current mirror circuits incorporating principles of the present invention are described below. The current mirror circuits provide, through an offset current mirror, an offset current which ensures that the output current of a primary current mirror is reduced to zero even when the input current is greater than zero. Additionally, the current mirror circuits of the present invention permit the offset current to be switched off at input currents above a predetermined threshold level. Thus, the primary current mirror is only operational within a given range, which assures improved accuracy during operating conditions at currents above the threshold.

Referring to FIG. 1(*a*), a conventional current mirror circuit 110 provides a controlled output current $I_{out}$ at terminal 112 in proportion to an input current $I_{in}$ at terminal 114. Current mirror 110 includes two PNP bipolar junction transistors 116 and 118 having their bases coupled together. The bases are also coupled to the collector of transistor 116 and terminal 114 to provide a path for the base currents. The emitters of transistors 116 and 118 are also coupled together to ensure that the base-emitter voltages of transistors 116 and 118 are equal, thereby ensuring that their emitter current densities are also equal. The ratio of the currents passing through transistors 116 and 118 ($I_{Q116}$ to $I_{Q118}$) will then be equal to the ratio of the emitter areas of the respective transistors 116 and 118, which can be controlled very accurately. Because $I_{Q118}$ is equal to $I_{out}$, and $I_{Q116}$ is approximately equal to $I_{in}$, the ratio of $I_{out}$ to $I_{in}$ must be approximately equal to the ratio of the respective emitter areas of transistors 116 and 118.

FIG. 1(*b*) shows a complementary prior art current mirror circuit 130. Current mirror 130 includes two NPN bipolar junction transistors 132 and 134 which provide a controlled output current $I_{out}$ at terminal 136 in proportion to an input current $I_{in}$ at terminal 138. The operation of current mirror circuit 130 is substantially similar to that described above for current mirror circuit 110.

FIG. 1(*c*) shows a general illustration of the highly linear relationship between $I_{in}$ and $I_{out}$ of the current mirror circuits of FIGS. 1(*a*) and 1(*b*). A disadvantage of circuit 110 in FIG. 1(*a*) and circuit 130 in FIG. 1(*b*) is that the output current $I_{out}$ does not equal zero unless the input current $I_{in}$ is also precisely zero. Small error offsets in the circuits providing the input currents can thus prevent $I_{out}$ from being completely shut off when it otherwise normally should be.

FIG. 2(*a*) is a schematic diagram of a conventional current mirror circuit 210 which employs intentional errors to ensure that the output current can be completely shut off, even when the input current is greater than zero. Current mirror 210 includes two PNP transistors 216 and 218 which are coupled together in the same configuration as current mirror circuit 110 of FIG. 1(*a*) (e.g., the bases are coupled together, output current $I_{out}$ is supplied at terminal 212 and input current $I_{in}$ passes through terminal 214). Current mirror circuit 210 differs from circuit 110 in that resistor 220 is coupled between the collector and emitter of transistor 216 to provide an offset current $I_{os}$ (typically about 0.01 times the maximum input current) to terminal 214. This offset current affects the current passing through transistor 216 as follows:

$$I_{Q216}=I_{in}-I_{os}$$

FIG. 2(*b*) shows a general illustration of the actual relationship between $I_{out}$ and $I_{in}$ for current mirror circuit 210 of FIG. 2(*a*). Line 222 shows that $I_{out}$ becomes zero when $I_{in}$ is reduced to a predetermined level of current ($I_{os}$). FIG. 2(*b*) also illustrates a conventional application of intentional gain error which causes the actual current response 222 to more accurately approximate the ideal response 224 at higher current levels.

One deficiency of current mirror circuit 210 of FIG. 2(*a*) is that the gain, which includes an intentional error (i.e., the offset current is always applied by resistor 220), is not accurate. Thus, the actual response 222 differs from the ideal response 224 by a varying amount. Therefore, the error is zero at only one point (i.e., at the point where response 222 crosses response 224).

Figure 3B:
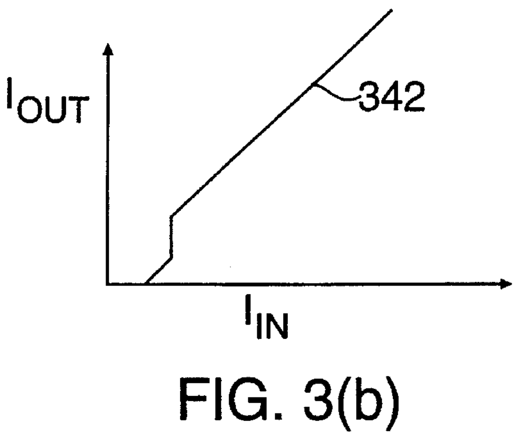

The deficiencies of the current mirror circuits described above are overcome by the current mirror circuits and methods of the present invention. FIG. 3(*a*) shows a current mirror circuit 300 in which the output current is reduced to zero when the input current falls below a predetermined level. Additionally, current mirror circuit 300 provides an output current which accurately conforms to the ideal response over a majority of the operational range of the circuit.

Referring to FIG. 3(*a*), current mirror circuit 300 includes current source circuit 302, offset current mirror 310, and primary current mirror 330. As discussed in greater detail below, current source circuit 302 provides, through offset current mirror 310, an offset current to primary current mirror 330. The offset current ensures that the output current is reduced to zero even when the input current is greater than zero. Current source circuit 302 allows the offset current to be switched off at input currents above a predetermined level, thereby assuring accurate operation of current mirror circuit 300 at current levels exceeding the predetermined level.

In accordance with the present invention, current mirror circuit 300 ensures that the output current $I_{out}$ at terminal 332 is reduced to zero as follows. Primary current mirror 330 includes input current transistor 336, output current transistor 338, and current feedback transistor 340. Primary current mirror circuit 330 thus has two output stages, each of which mirrors the current through transistor 336. Current feedback transistor 340 provides a current feedback signal $I_{Q340}$ which is proportional to current $I_{Q336}$.

Current source 302 operates by having switch 304 monitor the current feedback signal $I_{Q340}$. Switch 304 closes when $I_{Q340}$ falls below a predetermined threshold. When switch 304 closes, constant current source 306 causes offset current $I_{os}$ to pass through terminal 314 of offset current mirror 310. Offset current mirror 310 then provides (through terminal 312) to terminal 334 an offset mirror current $I_{Q318}$ in proportion to offset current $I_{os}$.

Offset current mirror 310 causes $I_{Q336}$ to be offset from $I_{in}$ by an amount equal to $I_{Q318}$. Thus:

$$I_{Q336}=I_{in}-I_{Q318}$$

Since the current $I_{out}$ through output transistor 338 mirrors only the current through transistor 336 ($I_{Q336}$), the output current $I_{out}$ through terminal 332 will also be reduced by an amount proportional to $I_{Q318}$, wherein the proportion is determined by the relative emitter areas of transistors 336 and 338, as is well known in the art. Therefore, $I_{out}$ is reduced to zero when $I_{in}$ is reduced to the level of the offset current.

Therefore, in accordance with the present invention, current mirror circuit 300 ensures accurate, undistorted operation, by eliminating the offset current when $I_{in}$ is greater than the predetermined threshold. When current feedback signal $I_{Q340}$ indicates that the input current is above the predetermined threshold, switch 304 opens, thereby reducing $I_{os}$, and hence $I_{Q318}$, to zero. This relationship is clearly illustrated by curve 342 in FIG. 3(*b*) which shows the relationship between $I_{in}$ and $I_{out}$ of current mirror circuit 300 of FIG. 3(*a*).

Thus, in accordance with the present invention, circuit 300 provides a highly accurate current mirror that ensures that the output current is reduced to zero when the input current is offset from zero by a predetermined amount.

Persons skilled in the art will appreciate that varying the times when switch 304 opens and closes will vary the magnitude of the offset current, and that the current mirror circuits of the present invention may be implemented such that the output current does not turn on until a certain value of input current is achieved (rather than the small ramp up shown in FIG. 3(*b*)).

Figure 4A:
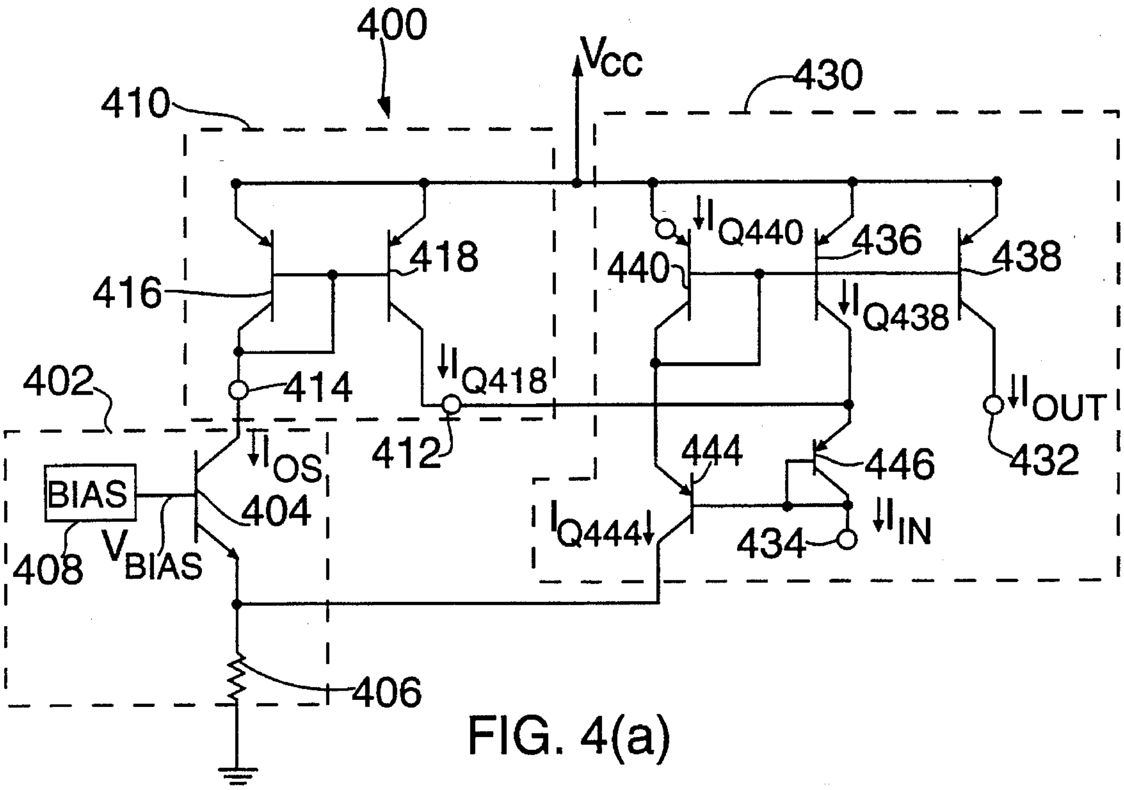
FIGS. 4(*a*) and 4(*b*) illustrate a schematic diagram of another embodiment of a current mirror circuit and method in accordance with the principles of the present invention.
Figure 4B:
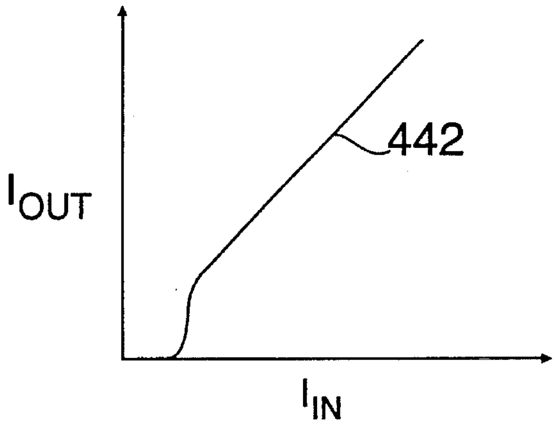

FIG. 4 is a schematic diagram of another preferred embodiment of a current mirror circuit 400 which incorporates principles of the present invention. Referring to FIG. 4, current mirror circuit 400 includes current source circuit 402, offset current mirror circuit 410, and primary current mirror 430, which operate in a manner similar to current mirror circuit 300 of FIG. 3(*a*). As explained in more detail below, circuit 400 provides an offset current to ensure that the output current is reduced to zero even when the input current is greater than zero. Similar to current source circuit 302 of FIG. 3(*a*), current source circuit 402 allows the offset current to be eliminated at input currents above a predetermined level, thereby assuring accurate, undistorted operation at such input current levels.

Referring to FIG. 4, primary current mirror 430 includes input current transistor 436, output current transistor 438, and current feedback transistor 440, which operate in a manner similar to their like referenced parts (transistors 336, 338 and 340, respectively) in circuit 300 of FIG. 3(*a*). Current feedback transistor 440 provides a current $I_{Q440}$ proportional to the current passing through transistor 436. Primary circuit 430 also includes cascade transistor 444 and diode-connected transistor 446 (which have their bases coupled together), to provide higher output impedance for the current feedback signal ($I_{Q444}$) which is provided to current source 402. The current feedback signal $I_{Q444}$ is approximately equal to $I_{Q440}$, where $I_{Q440}$ is determined by the relative emitter areas of transistors 436 and 440, as is well known in the art. Transistor 444 may be smaller than the other transistors (such as one third) without substantially affecting $I_{Q444}$.

Current source circuit 402 provides offset current $I_{os}$ through terminal 414 in response to current feedback signal $I_{Q444}$. Current source circuit 402 includes control transistor 404, voltage bias 408, and resistor 406. Offset current mirror circuit 410 operates in a substantially similar manner to offset circuit 310 of FIG. 3(*a*).

In accordance with the present invention, current mirror 400 ensures that the output current $I_{out}$ at terminal 432 can be reduced to zero as follows. At low input currents, $I_{Q444}$ is relatively small, such that the voltage across resistor 406 is reduced to a level which enables voltage bias 408 to turn on transistor 404. When transistor 404 is on, an offset current $I_{os}$ is provided to current mirror circuit 410. In a manner similar to the circuitry of FIG. 3(*a*), this offset current is mirrored by transistor 418 in offset current mirror 410 and is provided to the input branch of circuit 430 through terminal 412. Thus:

$$I_{Q436}=I_{in}-I_{Q418}$$

Thus, at low current levels (such as when $I_{in}$ is less than $I_{Q418}$), $I_{out}$ is offset by an amount proportional to $I_{os}$, ensuring that $I_{out}$ is reduced to zero even when $I_{in}$ is slightly greater than zero.

Also in accordance with the present invention, circuit 400 ensures accurate operation, by shutting off current offset $I_{os}$ when $I_{in}$ is substantially greater than $I_{os}$. When $I_{Q444}$ increases in response to higher values of input current $I_{in}$, the voltage across resistor 406 increases, thereby reducing the on state of transistor 404 (and its conduction capability) and reducing $I_{os}$. Offset current $I_{os}$ will be reduced to zero at a predetermined threshold of $I_{in}$ which causes $I_{Q444}$ to generate a voltage across resistor 406 approximately equivalent to the bias voltage $V_{BIAS}$. The input current threshold at which transistor 404 is turned on and off is thus determined by the relative sizes of transistors 440 and 436, and by the value of resistor 406, as is well known in the art.

The magnitude of the offset current and the point at which it is turned on and off can be controlled as follows. Transistor 404 turns on when the bias voltage minus the voltage across resistor 406 is equal to $V_{BE}$, (where $V_{BE}$ is the base-emitter voltage of transistor 404 when fully biased, typically 0.7 volts). Thus, $V_{BIAS}$ and resistor 406 can be chosen to turn on transistor 404 at a given level of $I_{Q444}$. Also, transistor 440 may be sized proportionately smaller than transistor 436 to reduce the relative magnitude of $I_{Q444}$. The magnitude of $I_{os}$ when transistor 404 is fully active is shown by the following equation:

$$I_{os}=(V_{BIAS}-V_{BE})/R1$$

(where R1 is the value of resistor 406). Ideally, transistor 404 turns on instantaneously when $I_{os}$ is equal to $I_{Q444}$. If transistors 440 and 436 are the same size, $I_{out}$ will be reduced to zero at this point. However, transistor 404 turns on gradually, not instantly, so that the current mirror response is similar to the response of current mirror circuit 300 which is shown in FIG. 4(*b*).

Figure 5:
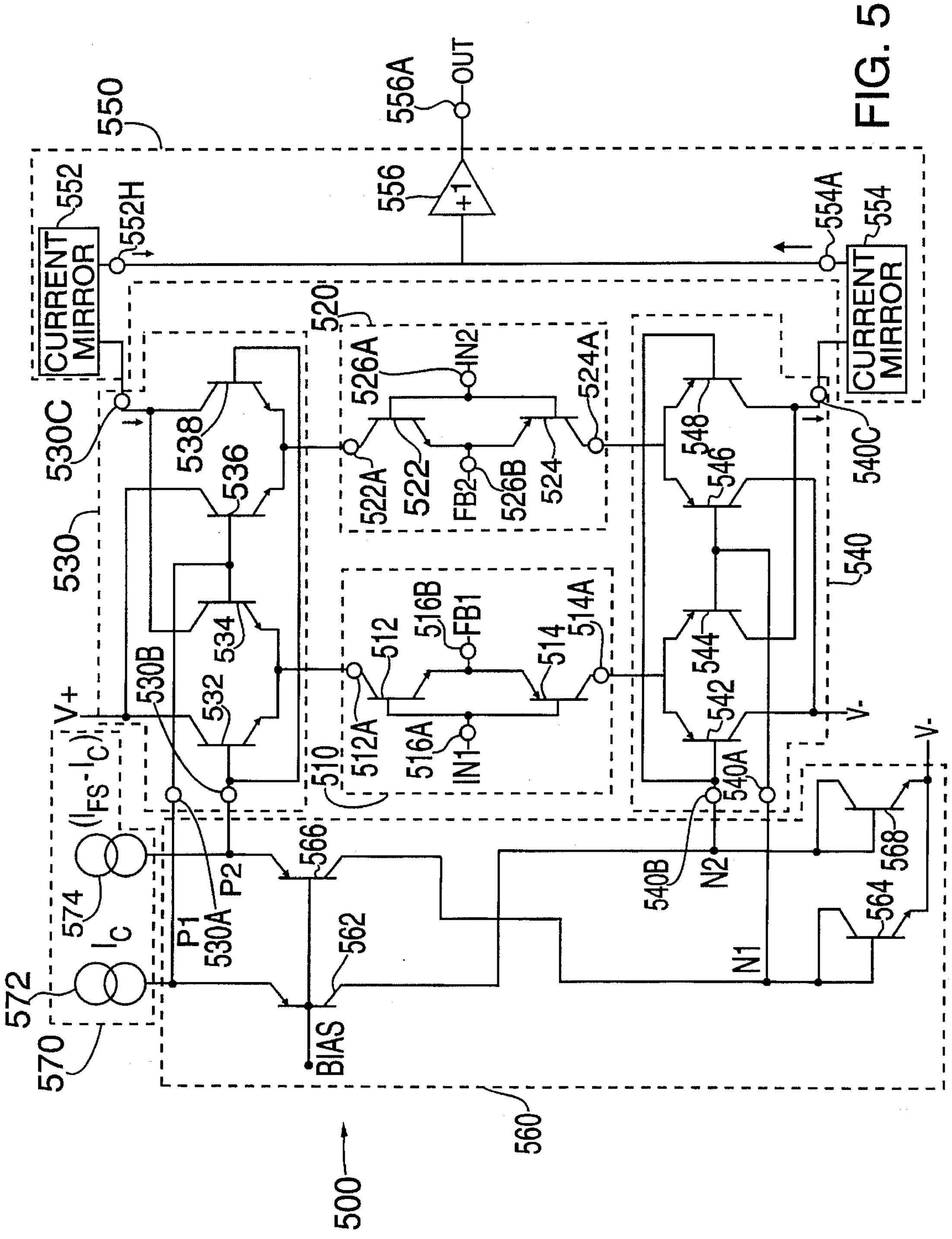
FIG. 5 is a schematic diagram of a two-input amplifier in accordance with the principles of the present invention.

As previously discussed, current mirrors are useful for controlling amplifiers. FIG. 5 is a schematic block diagram of a highly accurate, two-input amplifier, or fader, of the present invention.

Referring to FIG. 5, amplifier 500 includes input stages 510 and 520, cross-coupled multipliers 530 and 540, output stage 550, predistortion circuit 560, and control circuit 570. As discussed in greater detail below, cross coupled multipliers 530 and 540 steer output currents from input stages 510 and 520 to output stage 550. Control circuit 570 provides inversely related control currents to predistortion circuit 560, which generates the differential gain-control voltages for the cross-coupled multipliers 530 and 540.

In accordance with the present invention, amplifier 500 produces an output signal OUT at terminal 556A in response to a first input signal IN1, a first feedback signal FB1, a second input signal IN2, and second feedback signal FB2, which are applied to input stages 510 and 520. Input stages 510 and 520 each include a pair of complementary transistors which have their bases coupled. Input stage 510 includes NPN transistor 512, having a base coupled to terminal 516A and a collector coupled to terminal 512A, and PNP transistor 514, having a base also coupled to terminal 516A and a collector coupled to terminal 514A. The emitters of both transistors are coupled together and to terminal 516B. Input stage 520 is similarly configured, such that NPN transistor 522, PNP transistor 524, and terminals 526A and 526B are used in place of transistors 512 and 514 and terminals 516A and 516B, respectively.

Input stage 510 provides a first current through terminal 512A of transistor 512 or terminal 514A of transistor 514. The first current is proportional to the difference in voltage between IN1 and FB1. When IN1 is greater than FB1, transistor 512 conducts the first current through terminal 512A. Conversely, when IN1 is less than FB1, transistor 514 conducts the first current through terminal 514A. Additionally, amplifier 500 may employ negative feedback to couple terminal 516B to the output so that IN1 and FB1 are maintained at nearly the same voltage, as is well known in the art. Input stage 520 provides a second current through terminal 522A or terminal 524A, in a manner similar to input stage 510.

Cross-coupled multipliers 530 and 540 are substantially similar circuits. Multiplier 530 includes two pairs of NPN transistors having their emitters coupled. Transistors 532 and 534 have their emitters coupled to terminal 512A, while transistors 536 and 538 have their emitters coupled to terminal 522A. The bases of transistors 534 and 536 are coupled to terminal 530A, while the bases of transistors 532 and 538 are coupled to terminal 530B. The collectors of transistors 532 and 536 are coupled to a positive supply voltage V+, while the collectors of transistors 534 and 538 are coupled to terminal 530C. As stated above, multiplier 540 is substantially similar to multiplier 530. Thus PNP transistors 542, 544, 546 and 548 replace NPN transistors 532, 534, 536 and 538, respectively. Additionally, terminals 514A, 524A, 540A, 540B and 540C replace terminals 512A, 522A, 530A, 530B and 530C, respectively, and a negative supply voltage V− replaces the positive supply voltage V+.

Cross-coupled multipliers 530 and 540 steer the first and second currents to either the output or the power source in response to the control voltages across terminals 530A, 530B, 540A and 540B. Specifically referring to multiplier circuit 530, when the control voltage at terminal 530A (P1) exceeds the control voltage at terminal 530B (P2) by an amount equal to a forward-biased base-emitter junction, transistors 534 and 536 are turned fully on and transistors 532 and 538 are turned fully off. All of the first current through terminal 512A passes through transistor 534 and terminal 530C, thus providing an output current signal. The second current through terminal 522A is directed through transistor 536 and dumped to the positive voltage supply V+. Thus, the output current signal through terminal 530C matches the first current from the first input stage 510. Similarly, when the control voltage P2 exceeds P1 by an amount equal to one forward-biased base-emitter junction, the output current signal through terminal 530C matches the second current from input stage 520.

At intermediate voltage differentials between control voltages P1 and P2, the output current signal is a proportional mix of the first and second currents. Cross-coupled multiplier circuit 540 operates in a manner similar to circuit 530 (relying on control voltages N1 and N2 rather than P1 and P2). As discussed in more detail below, proper operation of circuit 500 requires that the differential control voltage (N1–N2) across terminals 540A and 540B be controlled to about the same level and polarity as the differential control voltage (P1–P2) across terminals 530A and 530B.

Output circuit 550 includes current mirror circuit 552 coupled to provide the first current output signal through terminal 530C, and current mirror circuit 554 coupled to receive the second current output signal through terminal 540C. Current mirrors 552 and 554 reflect current through terminals 552A and 554A, respectively, to output amplifier 556. Output amplifier 556, the design and operation of which is well known to those of ordinary skill in the art, produces output voltage OUT at terminal 556A in response to the reflected currents through terminals 552A and 554A.

Proper control of the differential control voltages is relatively significant to accurate gain control of amplifier circuit 500. Because the voltage-current characteristics of the steering transistors in circuits 530 and 540 are non-linear, the differential control voltages should be generated by inverse non-linear functions of an external control signal to make the gains of the input signals IN1 and IN2 linear functions of the external control signal. In accordance with the present invention, control voltages P1, P2, N1, and N2 are generated by predistortion circuit 560 in response to control circuit 570.

As discussed in greater detail below, control circuit 570 includes current sources 572 and 574, which generate control currents $I_C$ and $(I_{FS}\text{-}I_C)$, where $I_{FS}$ is a fixed full-scale reference such that the control currents are inversely related. Predistortion circuit 560 causes control current $I_C$ to generate voltage P1 across transistor 562 and voltage N2 across transistor 568. Likewise, current $(I_{FS}\text{-}I_C)$ generates voltage P2 across transistor 568 and voltage N1 across transistor 564. The voltage-current relationship between P1 and N2, and $I_C$, and between P2 and N1, and $(I_{FS}\text{-}I_C)$, is preferably substantially similar to a hyperbolic tangent function. Because the non-linear base-emitter characteristics of transistors 562,564,566, 568 match those of the current-steering transistors in circuits 530 and 540, predistortion circuit 560 causes circuits 530 and 540 to steer current from input stages 510 and 520 as a linear function of the control currents from 572 and 574.

Figure 6:
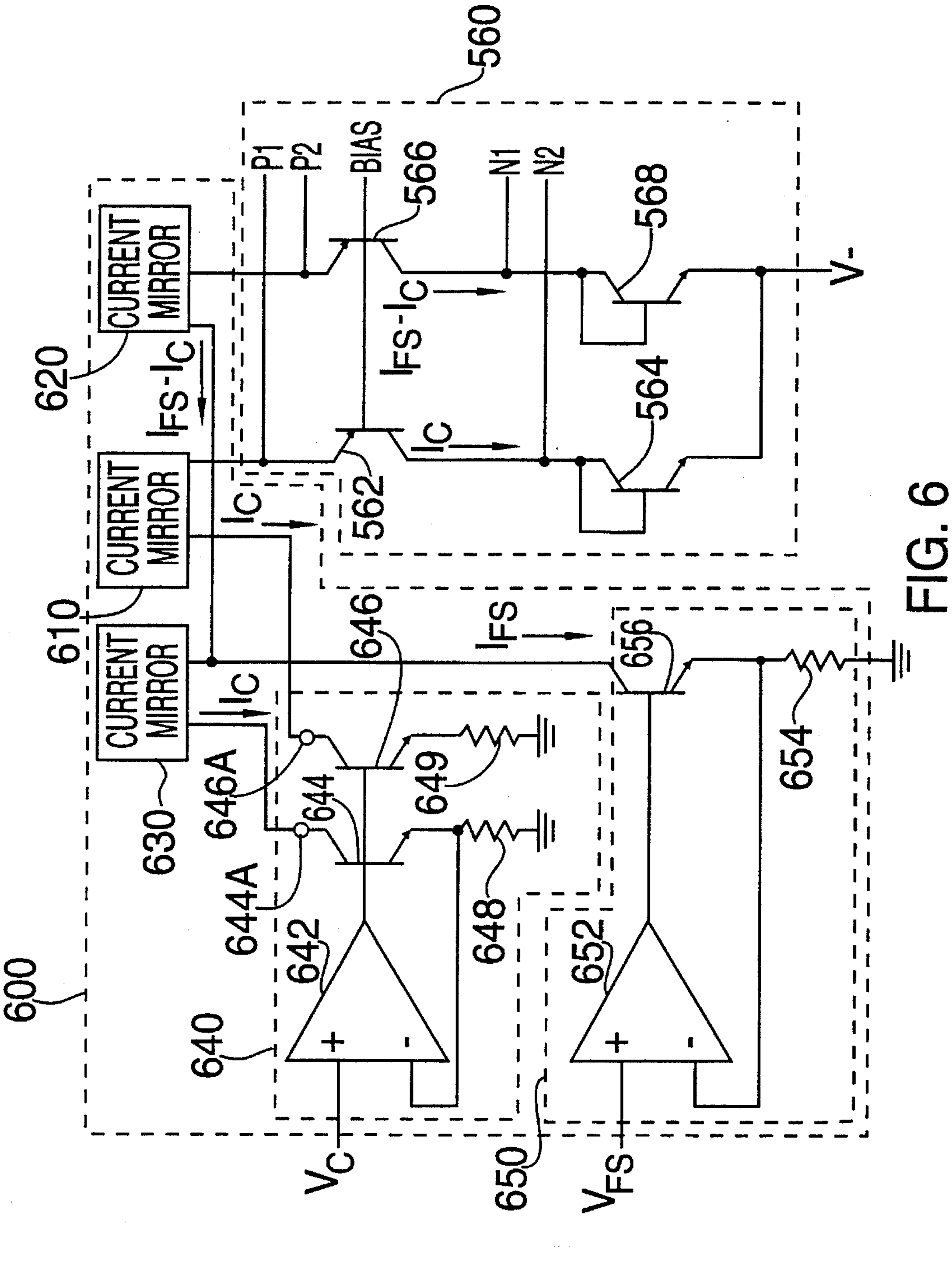
FIG. 6 is a schematic diagram of one embodiment of a gain control circuit constructed in accordance with the principles of the present invention.
Figure 7A:
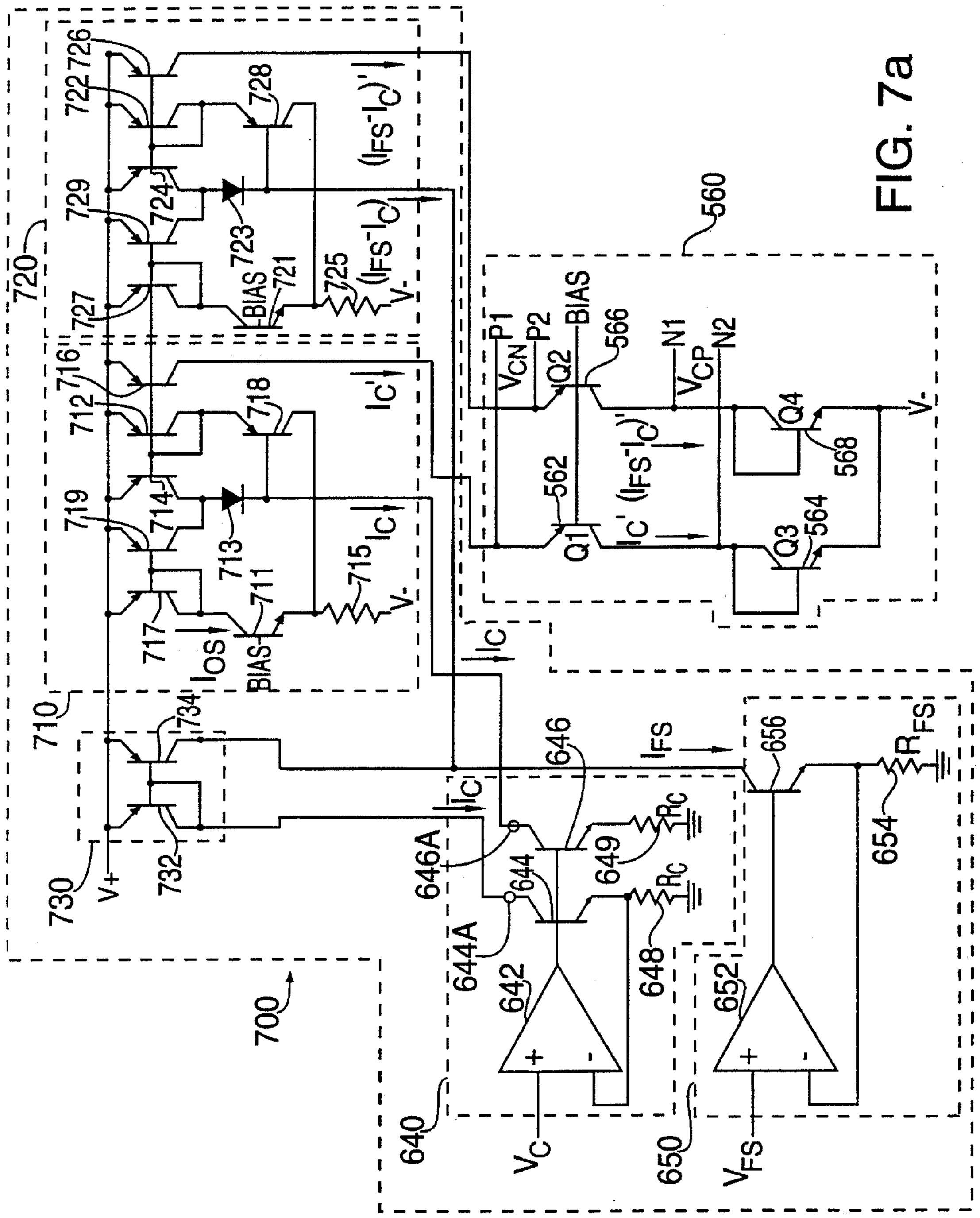
FIG. 7(*a*) is a schematic diagram of another embodiment of a gain control circuit constructed in accordance with the principles of the present invention.
Figure 7B:
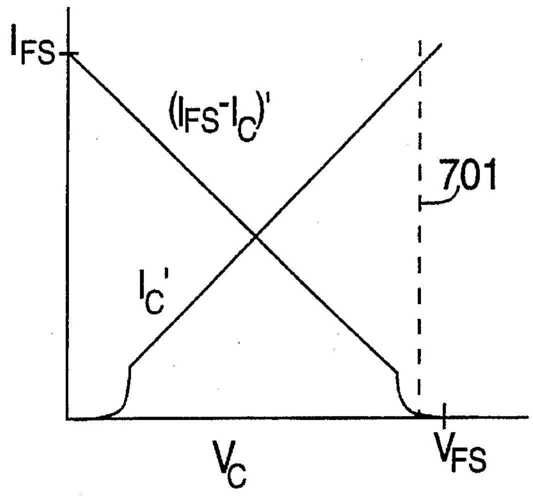
Figure 7C:
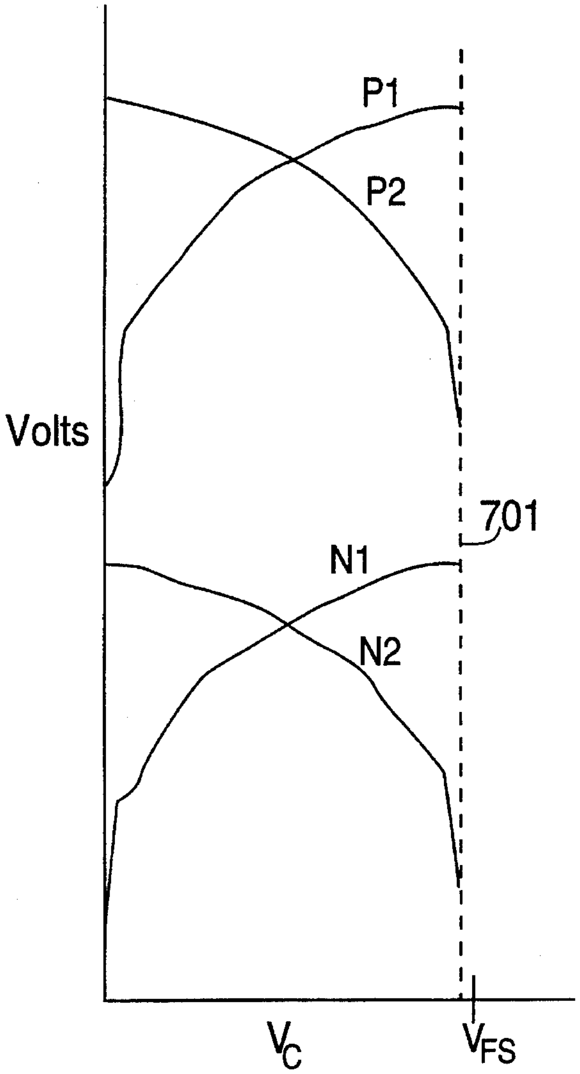
Figure 7D:
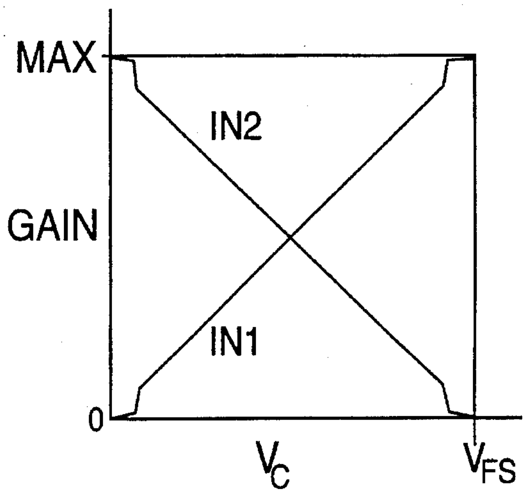

FIG. 6 shows a schematic block diagram of one embodiment of a gain control circuit 600 which may be used in place of control circuit 570 of FIG. 5. Control circuit 600 includes first and second current mirrors 610 and 620 which operate as current sources (similar to current sources 572 and 574 of FIG. 5). Control circuit 600 also includes additional current mirror 630 and operational amplifier circuits 640 and 650.

Operational amplifier circuit 640 includes operational amplifier 642 (opamp 642) having a non-inverting input coupled to a control voltage $V_C$, an inverting input and an output. The output is coupled to the base of a pair of NPN transistors 644 and 646 which have their collectors coupled to current mirrors 630 and 610 respectively (to generate current $I_C$). The emitter of transistor 644 is coupled to the non-inverting input of opamp 642 and to resistor 648. The emitter of transistor 646 is coupled to resistor 649. Resistors 648 and 649 are both selected to have a value of $R_C$.

Operational amplifier circuit 650 includes operational amplifier 652 (opamp 652) having a non-inverting input coupled to a control voltage $V_{FS}$ (a fixed full-scale reference), an inverting input coupled to a resistor 654 (which has a value of $R_{FS}$), and an output which is coupled to the base of NPN transistor 656. Transistor 656 has its emitter coupled to resistor 654 and its collector coupled to current mirrors 620 and 630 (to generate current $I_{FS}$).

Operational amplifier circuit 640 generates control current $I_C$ through terminals 644A and 646A in response to control voltage $V_C$. The level of $I_C$ is set by the equation:

$$I_C=V_C/R_C$$

Therefore, $I_C$ is a linear function of $V_C$. Operational amplifier circuit 650 generates a reference current $I_{FS}$ in response to $V_{FS}$ in a similar manner. In a preferred embodiment, $V_{FS}$ is a reference voltage equal to the full-scale value of $V_C$. Also in a preferred embodiment, $R_{FS}$ is of the same resistance as $R_C$, such that $I_{FS}$ is set to the full-scale value of $I_C$.

Current mirror 610 provides to predistortion 560 a reflected control current equal to the control current $I_C$ drawn through terminal 646A. Current mirror 630 provides to transistor 656 a reflected current equal to the control current $I_C$ drawn through terminal 644A. Because the current drawn from transistor 656 by opamp circuit 650 is fixed at IFS, the current drawn from current mirror 620 is set to $I_{FS}\text{-}I_C$. Current mirror 620 provides to predistortion circuit 560 a reflected control current equal to $I_{FS}\text{-}I_C$. Control circuit 600 is preferably implemented in an integrated circuit with amplifier circuit 500 such that the transistor devices are well matched.

In many applications using the above described amplifier or fader circuits, the control voltage $V_C$ is provided by an inexpensive operational amplifier circuit which, while substantially linear over most of its range, includes a small offset error. This offset error can prevent $V_C$ from reaching its minimum, usually zero. The error offset will therefore prevent $I_C$ or $(I_{FS}-I_C)$ from being completely reduced to zero.

This deficiency is overcome by gain control circuit 700, in accordance with the principles of the present invention. Referring to FIG. 7(*a*), gain control circuit 700 is a second preferred embodiment of a control circuit which incorporates the highly accurate current mirrors with guaranteed off state of the present invention. As explained in more detail below, the design of these current mirrors, which ensures that the current from each can be reduced to zero, in combination with the nonlinear function of predistortion circuit 560 in controlling the relative gains of the inputs to amplifier 500, ensures that when the voltage control signal passes the predetermined thresholds near each of its two extremes, the gain of one input will be fully attenuated and the other input will be forced to its maximum level.

Referring to FIG. 7(*a*), gain control circuit 700 includes operational amplifier circuits 640 and 650 and reference current mirror 730, which operate in a manner similar to the circuits shown in FIG. 6. Circuit 700 of FIG. 7(*a*) also includes first and second current mirrors 710 and 720. Current mirrors 710 and 720 operate in a manner similar to current mirror 400 of FIG. 4(*a*). When the current $I_C$ through diode 713 falls below a predetermined threshold, preferably 5 percent of $I_{FS}$, transistor 711 is biased on and generates an offset current $I_{os}$, preferably 5 percent of $I_{FS}$, which is reflected through transistor 719. This offset current causes the first control current $I_C'$ through transistor 716 to be set to $I_C-I_{os}$. Ideally, $I_C'$ is reduced to zero when $V_C$ causes $I_C$ to be reduced to the level of $I_{os}$. Similarly, second current mirror 720 causes second control current $(I_C-I_{FS})'$ to be set to $I_C-I_{FS}-I_{os}$ when $(I_C-I_{FS})$ falls below a predetermined threshold, also preferably 5 percent of $I_{FS}$.

In accordance with the present invention, when the control voltage passes a threshold offset by a predetermined amount from either zero or the full-scale value, the output of one or the other of current mirrors 710 and 720 will be offset to turn completely off, as shown in FIG. 7(*b*). When control circuit 700 is used in place of control circuit 570 in FIG. 5, control voltages P1, P2, N1 and N2 will respond as shown in FIG. 7(*c*). Although an offset error in $V_C$ may prevent $I_C'$ from reaching its maximum as $(I_{FS}-I_C)'$ is reduced to zero, as shown by line 701 of FIG. 7(*b*), the nonlinear voltage-current characteristics of predistortion circuit 560 cause the voltage at P1 to be less current sensitive than the voltage at P2, as shown in FIG. 7(*c*). Thus, when $(I_{FS}-I_C)'$ is reduced to zero, the voltage (P1–P2) is driven beyond its normal maximum level. FIG. 7(*d*) shows the resulting gain characteristics when the predistorted differential voltages (P1–P2) and (N1–N2) are applied to cross-coupled multipliers 530 and 540 of amplifier 500 of FIG. 5. The maximum gain, MAX, is determined by the feedback networks between OUT and feedback terminals FB1 and FB2, as is well known in the art. Because each cross-coupled multiplier controls only the relative contribution of current from each input stage 510 and 520 to the output 550, the gain at OUT is cut off at MAX and zero rather than continuing to vary with the increasing differential voltages (P1–P2) and (N1–N2).

Thus, in accordance with the present invention, control circuit 700 and amplifier 500 ensure that when the voltage control signal passes a predetermined threshold to turn completely off one current mirror and fully attenuate one amplifier input, the gain of the other signal is forced to its maximum level.

It will be apparent to those of ordinary skill in the art that although the present invention has been discussed above with reference to FIGS. 1–8, wherein the current mirrors comprise PNP-type bipolar junction transistors, the present invention is applicable to other types of current mirrors as well. For example, the current mirrors could comprise NPN-type bipolar junction transistors, or MOSFETs.

It will also be apparent that although the present invention has been discussed above with reference to a current feedback signal for causing the output current to be offset at predetermined current levels, other means for performing the same function are also available.

Persons skilled in the art will thus appreciate that the present invention can be practiced by other than the described embodiments, which are presented for purposes of illustration and not of limitation, and thus the present invention is limited only by the claims which follow.

What is claimed is:

1. A current mirror circuit for providing an output current substantially proportional to an input current, the output current being reduced to zero when the input current falls below a predetermined threshold value, the current mirror circuit comprising:

- an input terminal for receiving the input current;
- an output terminal for providing the output current;
- a primary current mirror circuit coupled to the input terminal, the primary current mirror circuit being responsive to the input current to generate a current substantially proportional to the input current at the output terminal, and to generate a current feedback signal from the primary current mirror circuit, the current feedback signal being substantially proportional to the input current;
- a current source circuit for receiving the current feedback signal, and for providing an offset current to offset the input current at the input terminal if the current feedback signal falls below a predetermined value, thereby indicating that the input current has fallen below the predetermined threshold value.

2. The current mirror circuit of claim 1, wherein the current source circuit comprises:

- a current source for providing current;
- a current-sensitive switch coupled to the current source for switching current from the current source in response to the current feedback signal falling below the predetermined value; and
- an offset current mirror circuit for receiving the current switched by the current-sensitive switch, the offset current mirror circuit providing the offset current to the input terminal, the offset current being substantially proportional to the current switched by the current-sensitive switch.

3. The current mirror circuit of claim 2, wherein the offset current mirror circuit comprises:

- a first PNP transistor having a collector coupled to the input terminal; and
- a second PNP transistor having a collector coupled to the switch, the bases of both transistors being commonly coupled and the emitters of both transistors being commonly coupled.

4. The current mirror circuit of claim 1, wherein the primary current mirror circuit comprises:

- a first PNP transistor having a collector coupled to the current source circuit;

a second PNP transistor having a collector coupled to the input terminal; and a third PNP transistor having a collector coupled to the output terminal, the bases of each transistor being commonly coupled and the emitters of each transistor being commonly coupled.

5. The current mirror circuit of claim 3, wherein the primary current mirror circuit comprises:

a third PNP transistor having a collector coupled to the current source circuit;

a fourth PNP transistor having a collector coupled to the input terminal and to the collector of the second PNP transistor; and a fifth PNP transistor having a collector coupled to the output terminal, the bases of each of the third, fourth and fifth transistors being commonly coupled and the emitters of each of the third, fourth and fifth transistors being commonly coupled.

6. The current mirror circuit of claim 5, wherein the primary current mirror circuit and the offset current mirror circuit are formed as a single integrated circuit.

7. The current mirror circuit of claim 2 wherein the current-sensitive switch comprises a transistor coupled in series with a resistor between the offset current mirror circuit and ground, the transistor being controlled by the current feedback signal.

8. The current mirror circuit of claim 4, wherein the primary current mirror circuit further comprises:

a fourth transistor coupled in series between the collector of the first transistor and the current source circuit; and a diode coupled in series between the collector of the second transistor and the input terminal, the diode having a cathode coupled to the base of the fourth transistor.

9. The current mirror circuit of claim 5, wherein the primary current mirror circuit further comprises:

a sixth transistor coupled in series between the collector of the third transistor and the current source circuit; and a diode coupled in series between the collector of the fourth transistor and the input terminal, the diode having a cathode coupled to the base of the sixth transistor.

10. A current mirror circuit which provides an output current in response to an input current of said current mirror being received at an input terminal thereof, wherein the output current is directly proportional to the input current over a predetermined range of input current values, and wherein the output current is offset when the input current falls outside the predetermined range, the current mirror circuit comprising:

an output terminal;

a first circuit coupled to the input terminal and the output terminal, the first circuit generating a current feedback signal indicative of the current received at the input terminal and providing to the output terminal the output current proportional to the current received at the input terminal; and a second circuit coupled to the input terminal, the second circuit providing an offset current to the input terminal when the current feedback signal indicates that the input current falls outside the predetermined range.

11. The current mirror circuit of claim 10, wherein the provided offset current is a non-linear function of the input current.

12. The current mirror circuit of claim 10, wherein the first circuit is a primary current mirror circuit comprising:

a first PNP transistor having a collector coupled to the second circuit;

a second PNP transistor having a collector coupled to the input terminal; and a third PNP transistor having a collector coupled to the output terminal, the bases of each transistor being commonly coupled and the emitters of each transistor being commonly coupled.

13. The current mirror circuit of claim 12, wherein the second circuit comprises:

a fourth PNP transistor;

an NPN transistor coupled in series with a resistor between the fourth PNP transistor and ground, the emitter of the NPN transistor and the resistor being coupled to the collector of the first PNP transistor, and the collector of the NPN transistor being coupled to the collector of the fourth PNP transistor; and a fifth PNP transistor having a collector coupled to the input terminal, the bases of the fourth and fifth PNP transistors being coupled together and the emitters of the fourth and fifth PNP transistors being coupled together.

14. The current mirror circuit of claim 13, wherein the five PNP transistors and the NPN transistor and the resistor are formed as a single integrated circuit.

15. A current mirror circuit for providing an output current substantially proportional to an input current of said current mirror being received at an input terminal thereof, wherein the output current is assured of being reduced to zero, the current mirror circuit comprising:

an input terminal for receiving the input current;

an output terminal for providing the output current;

offset current mirror means coupled to the input terminal for providing to the input terminal an offset current when the input current is indicative of passing a predetermined low current threshold; and current mirror means coupled to the input terminal for providing to the output terminal a current proportional to the input current in excess of the offset current.

16. The current mirror circuit of claim 15, wherein the offset current means comprises:

current source means for generating a predetermined offset current; and means for providing to the current mirror means the offset current, the offset current being directly proportional to the predetermined offset current.

17. The current mirror circuit of claim 16, wherein the current source means comprises:

a transistor switch for receiving a feedback signal from the current mirror means which is indicative of current received at the input terminal, the transistor switch also being coupled to the means for providing the offset current; and an impedance coupled to the transistor switch and to the current mirror means.

18. The current mirror circuit of claim 15, wherein the current mirror means comprises:

a first PNP transistor having a collector coupled to the offset current means;

a second PNP transistor having a collector coupled to the input terminal; and a third PNP transistor having a collector coupled to the output terminal, the bases of each PNP transistor being commonly coupled and the emitters of each PNP transistor being commonly coupled.

19. A method for operating a current mirror circuit to provide an output current in response to an input current of said current mirror being received at an input terminal thereof, wherein the output current is substantially proportional to the input current over a predetermined range of input current values, and wherein the output current is offset when the input current falls outside the predetermined range, the method comprising the steps of:

receiving the input current;

generating a current feedback signal that is proportional to the input current;

providing a primary offset current when the current feedback signal indicates that the input current has passed a predetermined threshold; and generating the output current, the output current being substantially proportional to the amount by which the input current exceeds the primary offset current.

20. The method of claim 19, wherein the step of providing comprises the steps of:

generating a secondary offset current when the current feedback signal has passed the predetermined threshold; and generating the primary offset current, the primary offset current being substantially proportional to the secondary offset current.

21. The method of claim 20, wherein the input current is received at an input terminal, and the offset current is provided to the input terminal.

22. The current mirror circuit of claim 2 wherein the current source and the current sensitive switch are independent circuits.

* * * * *

UNITED STATES PATENT AND TRADEMARK OFFICE

CERTIFICATE OF CORRECTION

PATENT NO. : 5,517,143

DATED : May 14, 1996

INVENTOR(S) : William H. Gross

It is certified that error appears in the above-indentified patent and that said Letters Patent is hereby corrected as shown below:

| Column | Line | |
|---|---|---|
| 10 | 62 | Change "IFS" to -- $I_{FS}$ --. |

Signed and Sealed this

Seventeenth Day of August, 1999

Attest:

Q. TODD DICKINSON

*Attesting Officer*

*Acting Commissioner of Patents and Trademarks*